United States Patent [19]
Albrechta et al.

[11] Patent Number: 5,145,553
[45] Date of Patent: Sep. 8, 1992

[54] METHOD OF MAKING A FLEXIBLE CIRCUIT MEMBER

[75] Inventors: Stanley M. Albrechta; Robert J. Clementi, both of Binghamton; Thomas E. Kindl, Endwell, all of N.Y.

[73] Assignee: International Business Machines Corporation, Armonk, N.Y.

[21] Appl. No.: 696,435

[22] Filed: May 6, 1991

[51] Int. Cl.$^5$ .................. B44C 1/22; B29C 37/00; C23F 1/00

[52] U.S. Cl. .................. 156/640; 156/630; 156/634; 156/656; 156/659.1; 156/666; 156/901; 252/79.2

[58] Field of Search ........... 156/630, 634, 640, 656, 156/659.1, 661.1, 664, 666, 901, 902; 29/846; 428/209, 332, 336, 458, 901; 252/79.2; 361/398; 174/250, 254

[56] References Cited

U.S. PATENT DOCUMENTS

| | | | |
|---|---|---|---|
| 2,684,892 | 7/1954 | Saulnier et al. | 252/79.2 X |
| 3,850,711 | 11/1974 | Conley | 252/79.2 X |
| 3,855,141 | 12/1974 | Ruff | 252/79.2 |
| 4,269,678 | 5/1981 | Faul et al. | 204/129.6 |
| 4,411,952 | 10/1983 | Sasaki et al. | 428/332 |
| 4,503,285 | 3/1985 | Darms et al. | 428/458 X |
| 4,543,295 | 9/1985 | St. Clair et al. | 428/458 |
| 4,675,246 | 6/1987 | Kundinger et al. | 428/336 |
| 4,681,654 | 7/1987 | Clementi et al. | 156/630 |
| 4,858,073 | 8/1989 | Gregory | 361/388 |
| 4,868,071 | 9/1989 | Walsh et al. | 428/626 |
| 4,883,718 | 11/1989 | Ohta et al. | 428/458 |
| 4,906,803 | 3/1990 | Albrechta et al. | 361/398 X |
| 4,917,758 | 4/1990 | Ishizuka et al. | 156/630 |

FOREIGN PATENT DOCUMENTS

437948 1/1975 U.S.S.R. .

OTHER PUBLICATIONS

IBM Technical Disclosure Bulletin vol. 12, No. 9, Feb. 1970 "Circuit Etching Process", by Butora et al.
IBM Technical Disclosure Bulletin vol. 30, No. 11, Apr., 1988, "Copper(I) Monitor For Etching Solutions" by Bindra et al.
IBM Technical Disclosure Bulletin vol. 30, No. 3, Aug., 1987, "Use Of Sacrificial Copper Allowing Removal By Mechanical Methods", by Carey et al.

*Primary Examiner*—William A. Powell
*Attorney, Agent, or Firm*—Lawrence R. Fraley

[57] ABSTRACT

A method of making a flexible circuit member including a stainless steel base member, a dielectric layer (polyimide) on the base member and a conductive circuit (copper) on the dielectric. The circuit member may be first formed as a laminate structure wherein the dielectric polyimide is coated on the stainless steel and appropriately treated (cured). The copper circuitry is then formed utilizing resist application and exposure techniques. Significantly, the copper-containing circuitry and stainless steel base member are simultaneously etched using a cupric chloride etchant solution to effectively remove desired portions of these metallic materials and produce the desired flexible circuit member.

15 Claims, No Drawings

METHOD OF MAKING A FLEXIBLE CIRCUIT MEMBER

TECHNICAL FIELD

The invention relates in general to the making of flexible circuit members and more particularly to such members which utilize a metallic base component or the like to provide support and flexibility for the final structure.

CROSS-REFERENCE TO CO-PENDING APPLICATION

In Ser. No. 07/695,850, entitled, "Method Of Laminating Polyimide To Thin Sheet Metal" (Inventors: Chen, Kindl, Rickerl, Schadt, Stephanie) there is defined a process for applying polyimide layers to a stainless steel substrate. Ser. No. 07/695,850 was filed May 6, 1991 and is mentioned further herein.

BACKGROUND OF THE INVENTION

Various types of flexible circuit members are, of course, well known in the art. Typically, such circuits include a dielectric (e.g., polyimide) substrate including therein and/or thereon conductive elements (e.g., copper wiring, patterned copper circuitry, etc.). A particular example of such a circuit member of more recent vintage is defined in U.S. Pat. No. 4,906,803 (Albrechta et al), which is assigned to the same assignee as the present invention. The member as defined in this patent includes the aforementioned dielectric substrate and includes thereon electrically conductive circuit pads and connecting circuit lines. As defined, one particular use for such a structure is to provide thin, flexible support for an electronic device to provide electrical connection between a magnetic head and disk drive as used in computer processors. The member makes it possible to locate the magnetic head relatively close to the disk drive, while avoiding possible damage to the head as a result of the spinning of the disk. The structure as defined includes a stainless steel foil member for providing flexibility and spring action, this foil having a layer of polymeric material (polyimide) thereon with the appropriate circuit pads and circuit lines located on the polymeric material. Various techniques are defined in U.S. Pat. No. 4,906,803 for making this circuit member.

As will be defined herein, the method of the instant invention is particularly suited for making flexible circuits such as defined in U.S. Pat. No. 4,906,303, which circuit members, as defined, assure both a flexible interconnection within the electronic component utilizing same in addition to a flexible connecting member of desired structural integrity able to withstand rapid, repeated movements thereof during component operation.

It is believed that a method for making a flexible circuit member as taught herein would constitute a significant advancement in the art.

DISCLOSURE OF THE INVENTION

It is, therefore, a primary object of the present invention to enhance the art of flexible circuit members.

It is another object of the invention to provide a method of making a flexible circuit member which can be accomplished in a facile manner, thereby substantially reducing the costs and time involved in making such members.

It is a still further object of the present invention to provide such a method which is adaptable to mass production techniques, thus further reducing the costs and time involved in utilizing same.

In accordance with one aspect of the invention, there is provided a method of making a flexible circuit member wherein the method comprises the steps of providing a base member which includes at least in part thereof stainless steel, providing a dielectric material on this base member, providing a layer of conductive material on the dielectric material wherein this conductive material includes at least in part copper, simultaneously etching both the base member and the conductive material using an etchant solution which includes cupric chloride for a predetermined time period to thus provide an etched subassembly, and thereafter rinsing the etched subassembly to remove any remaining etchant solution therefrom.

BEST MODE FOR CARRYING OUT THE INVENTION

For a better understanding of the present invention, together with other and further objects, advantages and capabilities thereof, reference is made to the following disclosure and appended claims.

As defined herein, an improved method of making a flexible circuit member is provided. The present method is capable of being operated in a more facile manner than any known techniques for producing such members, including that utilized in the aforementioned U.S. Pat. No. 4,906,803. As will be understood from the following, one significant aspect of this invention involves utilization of a singular composition of etchant to simultaneously etch both of the metallic elements of a flexible cable during manufacture thereof. It is to be understood from the following, however, that the unique etching technique of the present invention is not limited to flexible circuit members of the type particularly described in U.S. Pat. No. 4,906,803. As understood, the invention is particularly suited to any flexible circuit member including a stainless steel base member, a layer (including perhaps more than one sublayers) of dielectric material (e.g., polyimide) and a layer (including possibly one or more sublayers) of conductive material (e.g., copper) which will function as the conductive circuitry for the finished member. One example of another such flexible circuit member is defined in copending application under Ser. No. 07/695,850, filed May 6, 1991 (inventors: Kindl et al), this flexible circuit member including a stainless steel base, two sublayers of dielectric material (polyimide) and a layer of copper alloy foil laminated to this structure to serve as the circuit portion thereof when finally defined. As understood, the method of the present invention is readily suitable for utilization with laminated flexible structures of the type defined in Ser. No. 07/695,850.

The disclosures of U.S. Pat. No. 4,906,803 and EN991002 are incorporated herein by reference.

In order to provide a flexible circuit member in accordance with the teachings of this invention, a base member of stainless steel is initially provided. This base member is preferably of A.I.S.I. (American Iron and Steel Institute) 302 grade steel. This is also referred to under A.S.T.M. (American Society for Testing of Materials) designations A-167 and A-240. Stainless steel of this grade possesses an ultimate tensile strength of about 100,000 pounds per square inch (p.s.i.), an offset yield strength of about 40,000 p.s.i., a percent elongation (into inches) of about 50 percent and a hardness (Rockwell) rating of 885. As a nominal composition, the A.S.T.M. A-240 stainless steel includes approximately 9% nickel, 2% manganese and approximately 18.5% chromium. It is understood that the invention is not limited to this particular stainless steel in that others are capable of being used herein. The stainless steel base member is provided with an initial thickness of about 0.003 inch.

Onto this sheet of stainless steel is provided a layer of dielectric material which, as understood, will provide the substrate for the conductive circuitry to be added later. This dielectric material is preferably polyimide and may be applied as a singular layer or a plurality of individual sublayers. In accordance with the teachings herein, it is preferred to provide this as two separate individual sublayers. To do so, a coating of a solution of a precursor of an intractable polyimide such as Pyralin 5878 or Pyralin 2540 polyimide (PMDA-ODA type) available from E. I. DuPont de Nemours and Company (hereinafter DuPont) having a place of business at 1007 Market Street, Wilmington, Del., may be used. Pyralin is a registered trademark of DuPont. This Pyralin 5878 polyimide is a thermoset condensation polymer polyimide, which is basically a high temperature, elastic material. That is, it is capable of withstanding processing temperatures up to approximately 400 degrees Celsius (400° C.). Pyralin 5878 is fully imidized and cross-linked and does not have a discernible glass transition temperature, and is applied to the stainless steel base member to such a thickness that the resulting film after drying and curing will be approximately 4.0 microns. This material is then heated to a sufficient temperature for an appropriate time period to drive off the solvent yet not cause significant imidization of the material. Heating to approximately 85° C. for about 15 minutes has proven to be sufficient to effect solvent removal and thus provide a polyimide which is essentially dry and tack-free on the stainless steel. Understandably, this polyimide constitutes the first sublayer for the dielectric material of the invention.

Following the above step, a solution of a precursor of a thermoplastic polyimide is applied over the entractable polyimide film. A preferred type of polyimide for this second sublayer is Pyralin 2566 polyimide (6FPDA-ODA), also available from DuPont. Pyralin 2566 is a fluorinated cross-linking thermoplastic polyimide having a viscosity of about 12–16 poise and a density (at 25° C.) of about 1.06 grams per cubic centimeter. The Pyralin 2566 is applied to a sufficient thickness such that when dried and cured, it will possess a thickness of only about two microns. This coating is also dried to remove solvent and produce a dry, tack-free essentially non-imidized film. Drying is accomplished at a temperature of about 85° C. for approximately 15 minutes.

It will be understood that the two polyimide precursors defined above are both supplied as organic solutions. Depending on the coating method, film thickness, and other parameters, the viscosity of these polyimides may be altered by the addition of appropriate solvent. The two polyimide precursor films are subject to a curing process which will rapidly imidize the polyimides of both sublayers without causing substantial cross-linking. This is preferably performed by exposing these to infrared radiation (IR) in the near infrared region (a 2.82–3.28 micron wavelength) while simultaneously heating these sublayers to a temperature of about 250° C. This process preferably occurs in an oven heated by infrared radiation and controlled temperature range such that the IR not only heats the furnace but also significantly increases the reaction for imidization without inducing significant cross-linking. The utilization of IR makes it possible to quickly imidize both polyimides to a substantial extent without such cross-linking, which is considered important with respect to thermoplastic polyimide due to the fact that as cross-linking thereof progresses, the glass transition temperature rises and in subsequent processing it would be necessary to heat the thermoplastic polyimide above such a glass transition temperature to effect metal bonding. Avoidance of substantial cross-linking at this stage in the process assures that bonding can be accomplished at relatively low temperatures.

The resulting structure as produced so far comprises a thin stainless steel base member having thereon dielectric material in the form of two sublayers of essentially fully imidized polyimide, the polyimide material incurring no substantial cross-linking. As defined, the stainless steel base member has the aforementioned thickness of only about 0.003 inch. The desired thickness for the first polyimide sublayer (the Pyralin 5878) as provided above is about 0.000157 inch, while the desired thickness for the second sublayer (the Pyralin 2566) is about 0.000079 inch, resulting in an overall dielectric thickness of about 0.000236 inch.

The next step in the process is to provide a layer of conductive material which, as defined, will function as the member's circuitry. This is preferably accomplished by providing a layer of metallic foil which is laminated to the upper polyimide sublayer in the manner defined below. The preferred metallic foil is a copper alloy under A.S.T.M. specification number B465, which alloy is also available from Olin Specialty Metals Corporation under alloy number 194. A.S.T.M. B465 includes about 97.5% copper, 2.35% iron, 0.03% phosphorous and 0.12 % zinc. This alloy possesses a coefficient of thermal expansion of about 9.8 inches/inch/degree Fahrenheit $(F) \times 10^{-6}$ within a temperature range of 20° C. to 300° C.

In order to laminate the alloy to the stainless steel-polyimide member, these three elements are stacked within a laminating press and a pressure of approximately 10 PSI is applied. A conventional laminating press may be utilized, one example being a model MTP24 lamination press manufactured by the Tetrahedron Corporation of San Diego, Calif. The press temperature is raised during this lamination to a temperature of about 340° C. for a period of approximately 40 minutes. Doing this step, any gas trapped within the polyimides or formed by virtue of this heating will be driven to the alloy-polyimide interface. Utilizing a low pressure as defined enables the trapped gasses to escape and not remain trapped in the final laminate. At this point, both polyimides have cross-linked to some extent internally and at the interface thereof. The thermoplastic polyimide glass transition temperature is still relatively low, however, allowing it to flow well for bonding at such lower temperatures (340° C.). The pressure applied by the press is then increased relatively quickly to about 670 PSI and the temperature raised to about 360° C. This results in the thermoplastic polyimide flowing sufficiently to form a substantially strong and continuous bond between the alloy and the thermoplastic polyimide. Cross-linking occurs between the intractable polyimide and the thermoplastic polyimide to form essentially a unitary, cured polyimide structure for the dielectric material. The defined pressures and temperatures are gradually reduced (to below approximately 50° C.) and the structure removed. The resulting alloy-dielectric-stainless steel subassembly possesses an overall thickness of about 0.0039 inch, thus being relatively thin as desired.

To prepare this subassembly for circuitization of the copper alloy foil, the subassembly is subjected to a precleaning operation. Significantly, the purpose of this preclean is to prepare both the alloy and stainless steel surfaces for subsequent adhesion of appropriate photoresist material (to be defined below). This precleaning involves spraying both surfaces with an alkaline potassium permanganate solution comprised of about 4.2% by weight potassium permanganate, 1.8% by weight sodium hydroxide and the balance deionized water. The precleaning occurs at a temperature of about 100° F. and at a pressure of about 10 PSI. The subassembly is then rinsed with deionized water, following which an oxalic solution is sprayed on both metallic surfaces. The preferred acid solution is comprised of about 8.5% by weight oxalic acid and the balance deionized water. The acid is preferably sprayed at a pressure of 6 PSI and at a temperature of about 25° C. This subassembly is then rinsed, again with deionized water.

The structure as now cleaned is ready for application of the appropriate photoresist material thereto. As defined herein, this resist is applied to both sides (metallic surfaces) of the subassembly and preferably as part of a hot roll laminate procedure. Hot rolling of dry film resists to form laminate elements is known and thus equipment suitable for such purpose may be utilized here as well. The preferred dry film resist to be used at this stage of the invention is Riston 4106 dry film resist, available from DuPont. (Riston is also a registered trademark of DuPont.) Riston 4106 is an aqueous-processable, photo-polymer dry film resist adopted for high productivity print and etch applications and is available in a variety of thicknesses. Such resists offer relatively wide processing latitude, high resolution, and compatibility with various automatic processing techniques. The desired laminating pressure for applying both film layers to the opposite sides of the subassembly is about 30 PSI, and the desired laminating temperature is about 105° C.

The next step in producing the flexible circuit member of the invention involves exposing the laminated subassembly having the aforementioned resist on both sides thereof. This exposure involves alignment of a photo mask against the respective subassembly sides to expose desired areas thereon. Simultaneous exposure occurs using ultraviolet (UV) light through the application of about 35 millijoules of energy. Known exposure equipment may be utilized to accomplish this. It is understood that at this point in the invention, the desired circuit pattern on the alloy is now exposed while the desired portions of the stainless steel base material to be removed are similarly exposed. Understandably, the resulting circuit pattern will function in accordance with the desired operational characteristics for this circuitry. In comparison, the ultimately removed portions of the stainless steel base member will result in a base component capable of being flexed in accordance with the operational requirements thereof, while simultaneously assuring sufficient support for the final circuit member. For example, it may be desirable to remove selected portions of the stainless steel so as to provide a flexure joint at selected locations within the final circuit member structure such that the circuit member may be flexed (bent) to satisfy operational (e.g., motion) requirements (e.g., as imposed by the aforedescribed magnetic head and disk drive elements).

In order to develop the exposed dry film resist images, the subassembly is now sprayed with an appropriate developing solution. A preferred solution comprises about 0.85 to about 0.95 percent by weight sodium carbonate and the balance deionized water. This solution is sprayed at a pressure of about 15 PSI and a temperature of about 25° C. within a conventional spraying chamber. Subsequently, the developed subassembly is rinsed through application of a deionized water spray thereon.

In accordance with the unique teachings of the present invention, the subassembly as thus produced (including the stainless steel base member, dielectric material and conductive metallic layer) is subjected to an etching process which, as defined, will effect the substantially simultaneous removal of both stainless steel and copper alloy metals from the subassembly so treated. This etching procedure represents a significant aspect of the present invention in that it enables simultaneous removal of both metals to produce the resulting metallic configurations for the invention. Understandably, the exposed portions of these metals are removed, the remaining portions not being removed still covered with the undeveloped resist material defined above. This remaining resist material thus serves to protect the portions of these metallic surfaces wherein metal removal is not desired.

The preferred etchant solution as utilized in this step of the invention comprises from about 39.0 to about 44.0 percent by weight cupric chloride, from about 3.20 to about 4.00 percent by weight hydrochloric acid and the balance deionized water. This etching occurs preferably at a temperature of about 50° C. and involves placement of the laminate subassembly as defined above on a horizontal, open conveyor passed through the chosen etch chamber. Known etch chambers may be utilized to provide this step in the invention. The moving subassemblies are passed horizontally through the etch chamber at a speed of about 30 centimeters per minute so as to expose the surfaces being etched to the above solution for a time period of about 42 second. As a result, the copper alloy is etched at a rate of from about 0.00075 to about 0.00125 inches per minute while the stainless steel base member is etched at a rate of from about 0.0035 to about 0.0050 inches per minute. The result when this subassembly is removed from the etching chamber is a structure wherein both metals have been substantially etched through to the interim polyimide dielectric material. By providing the aforementioned etching solution spray at the temperatures and times defined, in combination with the associated ratio of thicknesses between the stainless steel and copper alloy, this structure, having both metals etched to this depth, is uniquely provided. It has been determined that a preferred ratio of thicknesses between the stainless steel and copper alloy for the invention's conductive material are preferably within the range of about 3.5:1 to about 5.0:1. The above parameters are of course not meant to limit the invention in that other solutions including cupric chloride may be utilized, as well as correspondingly different temperatures and etch times. In one specific example of the invention, an etchant solution comprising about 41 percent by weight cupric chloride, about 3.6 percent by weight hydrochloric acid and the balance deionized water was utilized. The subassembly being etched was passed horizontally through an etching chamber which included therein a plurality of spray bars located above and below the conveyor, each bar including alternating numbers (e.g., 3,4) of nozzles per bar. Each nozzle sprayed etchant in a fan-shaped pattern of about 74 degrees. A spray rate of about 1.4 gallons of solution per minute per nozzle was utilized. Following etching, the etched subassembly was sprayed with deionized water to substantially remove any etchant remaining thereon. The described rate of movement for the subassembly being etched is, as defined, 30 centimeters per minute. It is preferred that a movement within the range of from about 20 to about 40 centimeters per minute be utilized, in combination with an etch time period within the range of from about 35 to about 50 seconds. Again, however, the invention is not limited to these specific parameters, which parameters may be modified with others (e.g., etchant solution compositions) taught herein.

It was determined that during etching using the aforementioned horizontal, open conveyor, that more effective etching of the subassembly occurred with the stainless steel base member oriented in the face down position (the copper alloy conductive layer thus facing upward). It was determined that more effective etching occurs because of the continuous spraying in an upward manner of the thicker stainless steel, as opposed to the downward spraying on the copper alloy wherein pools or the like of etchant may occur during spraying. Etching in this orientation assures a continuous, non-impeded spray of etchant against the stainless steel to thus further assure complete etching thereof through to the polyimide (dielectric) interim layer.

A key element in the defined etch process is control of the stainless steel sidewall profile. This is determined by the appropriate combination of stainless steel etch rate, etch temperature, conveyor speed, etch orientation, and, to a lesser degree (but still important), etch chemistry concentration. It has been observed that copper alloys simultaneously etched can survive significant over-etching in cupric chloride solutions, due to the etch time required for complete stainless steel etch, without adverse effect on the copper sidewall profile. This allows greater latitude in general etch parameters, especially those affecting copper etch, subject to the simultaneously etched stainless steel requirements.

As defined, the invention involves the utilization of cupric chloride as a key element of the etchant solution. Various cupric chloride etchant solutions have been utilized to etch printed circuits including copper circuitry as part thereof. Heretofore, however, when a different metal (e.g., stainless steel) is incorporated as part of the flexible circuit member structure, one technique for etching this material has been to utilize a separate etching step and a different etchant solution (one using ferric chloride, a known etchant for stainless steel). See, for example, the aforementioned U.S. Pat. No. 4,906,803. As described herein, it has been found, surprisingly, that utilizing an etchant solution containing cupric chloride results in effective simultaneous etching of a conductive material including copper and a separate metallic material containing stainless steel located on opposite sides of a dielectric material. Use of cupric chloride for this singular, simultaneous etching operation possesses several advantages over a dual step etch process involving different etchant solutions. For example, the cupric chloride solution etches at a rate greater than ferric chloride, the etchant further exhibits greater anisotropy and sidewall profile integrity within the stainless steel than when utilizing ferric chloride, and cupric chloride etchants as used herein are regenerable and reclaimable. The cupric chloride etchant solution as defined herein further assures a substantially stable etch rate for the stainless steel in combination with a simultaneous copper etch, as opposed to use of ferric chloride which has proven to be drastically affected as a result of copper accumulation with the ferric chloride solution. Understandably, the aforementioned savings in time and cost are also realized using a singular etchant solution as defined herein.

Following etching, the subassembly is rinsed using deionized water to remove any etchant solution remaining thereon. Following this step, removal of any protective resist from both the conductive copper material and stainless steel base member is accomplished by spraying the subassembly with a resist strip solution containing about 3.2 to about 3.4 percent by weight sodium hydroxide and the balance deionized water. This spray is directed at a pressure of about 20 PSI and a temperature of about 50° C., following which a deionized water spray is also applied to rinse the subassembly. Following this step, the subassembly may then be subjected to plating of desired portions of the defined conductive circuitry thereon with a selected precious metal (e.g., gold) using techniques well known in the art. Such overplatings primarily assure corrosion prevention in such finished circuit articles.

Thus there has been shown and described a method of making a flexible circuit member which includes a stainless steel base member, a dielectric layer thereon, and a layer of conductive material (including copper) on the dielectric. The method as defined is accomplished in an electroless manner and, as defined, may be accomplished using many known components (e.g., etching chamber) available in the industry. The method as defined is thus capable of being accomplished in a facile manner and at relatively reduced cost and time over known processes, which typically required at least two different etchants and etching steps when treating different metals.

What is claimed is:

1. A method of making a flexible circuit member, said method comprising:
   providing a base member including at least in part stainless steel and having a first predetermined thickness;
   providing a dielectric material on said base member, said dielectric material having a second predetermined thickness;
   providing a layer of conductive material including at least in part copper on said dielectric material, said conductive material having a third predetermined thickness;
   simultaneously etching said base member and said conductive material using an etchant solution including cupric chloride for a predetermined time period to provide an etched subassembly; and thereafter
   rinsing said etched subassembly to substantially remove said etchant solution therefrom.

2. The method according to claim 1 wherein said etching is achieved in an electroless manner.

3. The method according to claim 1 wherein said dielectric material is comprised of polyimide.

4. The method according to claim 3 wherein said dielectric material is provided on said base member in first and second sublayers, each of said sublayers being comprised of polyimide.

5. The method according to claim 4 wherein said first sublayer comprises an intractable polyimide precursor and said second sublayer comprises a thermoplastic polyimide.

6. The method according to claim 1 wherein said base member is comprised of A.I.S.I. Grade 302 stainless steel.

7. The method according to claim 1 wherein said conductive material is comprised of A.S.T.M. B465 copper-iron alloy.

8. The method according to claim 1 wherein said etchant solution comprises from about 39 to about 44 percent by weight cupric chloride, from about 3.20 to about 4.00 percent by weight hydrochloric acid, and the remainder deionized water.

9. The method according to claim 1 wherein said base member, dielectric material and conductive material are positioned in a substantially horizontal orientation during said etching.

10. The method according to claim 9 wherein said base member, dielectric material and conductive material are passed through an etching chamber during said etching.

11. The method according to claim 10 wherein said base member, dielectric material and conductive material pass through said etching chamber during said etching at a rate of from about 20 to about 40 centimeters per minute.

12. The method according to claim 11 wherein said predetermined time period of said etching is within the range of from about 35 seconds to about 50 seconds 13. The method according to claim 12 wherein said conductive material is etched at a rate of from about 0.00075 to about 0.00125 inches per minute and said base member is etched at a rate of from about 0.0035 to about 0.0050 inches per minute.

14. The method according to claim 10 wherein said etchant is sprayed onto said base member and said conductive material within said etching chamber, said base member being oriented in a face down position and said conductive material being oriented in a face up position.

15. The method according to claim 1 wherein the ratio of thicknesses of said base member to said layer of conductive material is within the range of from about 3.5:1 to about 5.0:1.

* * * * *